(12) United States Patent
Kang

(10) Patent No.: US 12,111,364 B2
(45) Date of Patent: Oct. 8, 2024

(54) APPARATUS FOR AND METHOD OF NON-DESTRUCTIVE-TYPE DIAGNOSIS OF DEGREE OF BATTERY DEGRADATION

(71) Applicants: HYUNDAI MOTOR COMPANY, Seoul (KR); KIA CORPORATION, Seoul (KR)

(72) Inventor: Chun Yong Kang, Yongin-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 116 days.

(21) Appl. No.: 17/893,487

(22) Filed: Aug. 23, 2022

(65) Prior Publication Data
US 2023/0236260 A1 Jul. 27, 2023

(30) Foreign Application Priority Data
Jan. 27, 2022 (KR) .................. 10-2022-0012461

(51) Int. Cl.
*G01R 31/392* (2019.01)
*G01J 5/00* (2022.01)
(Continued)

(52) U.S. Cl.
CPC .............. *G01R 31/392* (2019.01); *G01J 5/00* (2013.01); *G01R 31/374* (2019.01);
(Continued)

(58) Field of Classification Search
None
See application file for complete search history.

(56) References Cited

U.S. PATENT DOCUMENTS

| 7,959,353 B2 | 6/2011 | Anantharaman |
| 8,162,020 B2 | 4/2012 | Anantharaman |

(Continued)

FOREIGN PATENT DOCUMENTS

| KR | 101860201 B1 | 5/2018 |
| KR | 102050335 B1 | 12/2019 |

(Continued)

*Primary Examiner* — Jas A Sanghera
(74) *Attorney, Agent, or Firm* — Lempia Summerfield Katz LLC

(57) ABSTRACT

Disclosed is an apparatus for non-destructive-type diagnosis of a degree of degradation of a battery. The apparatus includes: a chamber inside which a battery subject to inspection is arranged; a charging and discharging unit connected to a lead portion of the battery and charging or discharging the battery; a thermoelectric element module thermally connected to the battery and generating an electromotive force caused by heat generated by charging and discharging the battery; a first measurement unit measuring the electromotive force generated by the thermoelectric element module; a second measurement unit measuring a change in impedance due to the charging and discharging of the battery; and a determination unit comparing data on the electromotive force of the battery, measured by the first measurement unit, and data on the impedance of the battery, measured by the second measurement unit, with pre-prepared comparative data and determining a degree of degradation of the battery.

17 Claims, 5 Drawing Sheets

(51) Int. Cl.
*G01R 31/374* (2019.01)
*G01R 31/389* (2019.01)
*H02J 7/00* (2006.01)

(52) U.S. Cl.
CPC ............ *G01R 31/389* (2019.01); *H02J 7/005* (2020.01); *G01J 2005/0077* (2013.01)

(56) References Cited

U.S. PATENT DOCUMENTS

| | | |
|---|---|---|
| 9,177,466 B2 | 11/2015 | Xie et al. |
| 2007/0047796 A1 | 3/2007 | Anantharaman |
| 2009/0087083 A1 | 4/2009 | Anantharaman |
| 2010/0090702 A1 | 4/2010 | Mcmillen et al. |
| 2017/0074731 A1* | 3/2017 | Santhanagopalan ........................ H01M 10/4285 |
| 2018/0252776 A1* | 9/2018 | Takechi ................ G01R 31/389 |
| 2022/0365038 A1* | 11/2022 | Ma ........................ G01N 29/225 |

FOREIGN PATENT DOCUMENTS

| | | |
|---|---|---|
| KR | 20200042044 A | 4/2020 |
| KR | 20210108076 A | 9/2021 |
| WO | 2007025021 A2 | 3/2007 |

\* cited by examiner

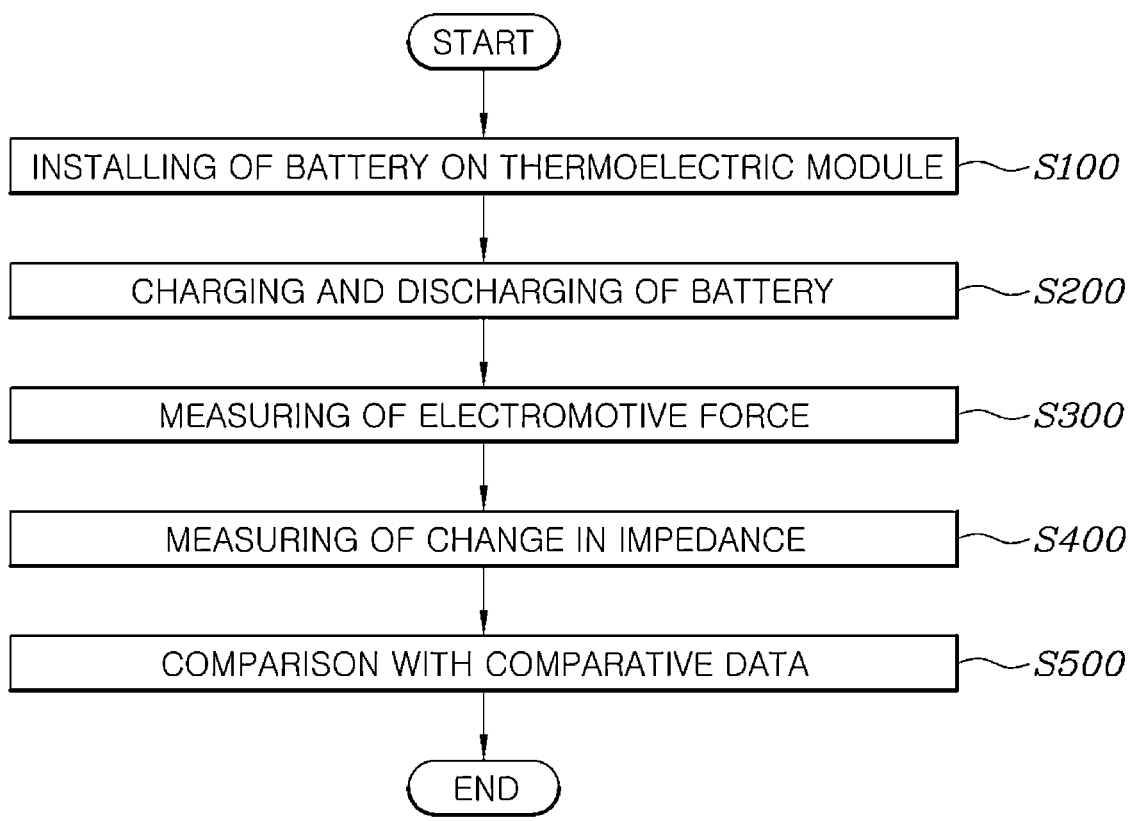

APPARATUS FOR AND METHOD OF NON-DESTRUCTIVE-TYPE DIAGNOSIS OF DEGREE OF BATTERY DEGRADATION

CROSS REFERENCE TO RELATED APPLICATION

This application claims priority to and the benefit of Korean Patent Application No. 10-2022-0012461, filed Jan. 27, 2022, the entire contents of which are incorporated herein by reference.

BACKGROUND

Field

The present disclosure relates to an apparatus for and a method of non-destructive-type diagnosis of a degree of battery degradation. Both of the apparatus and the method are capable of quantifying an amount of heat generated in a battery and thus diagnosing a degree of battery degradation without disassembling the battery.

Description of the Related Art

A high-voltage battery, in which an electrochemical reaction occurs, is a high-capacity and high-output battery 100 operating as one system and is utilized as an energy source for fundamentally driving a motor for vehicle traveling. Particularly, environment-friendly vehicles, such as electric vehicles and hydrogen fuel cell vehicles, are each equipped with the high-voltage battery and are driven using electric energy stored in the high-voltage battery.

A distance the vehicle can travel, a motor maximum output, and the like are determined by a capacity or voltage of the battery. The more increased the usage time of the battery, the more increased impedance inside the battery. Accordingly, degradation of the battery occurs. The degradation of the battery causes a decrease in output performance, a decrease in capacity, and the like. Thus, acceleration performance of a vehicle that uses the battery is reduced, or the distance the vehicle can travel is decreased.

Therefore, accurate estimation of the degradation of the battery used in the vehicle can accurately predict driving performance of the vehicle and the distance the vehicle can travel and can make it possible to perform a diagnosis function in accordance with a state of the battery or to provide information on a replacement period of the battery. Therefore, the convenience of a driver driving the vehicle can be improved.

In the related art, in most cases, a technique of diagnosis of the battery is to predict the degree of degradation of the battery or the life thereof. For this prediction, an electrochemical-based degradation model of the battery is established, and then measurement data of the battery are applied to the degradation mode of the battery.

Specifically, in the related art, an ex-situ analysis technique (destructive analysis technique) is primarily used to diagnose the battery. In this technique, charging and discharging of the battery and other electrochemical reactions in the battery are performed. When the reactions are finished, a target subject to analysis is separated and collected to conduct an experiment.

In other words, the technique of diagnosis of the battery in the related art shows only the product that results when the reaction in the battery is finished. Thus, there is a problem that the progress of the electrochemical reaction is not directly shown and that the detailed internal properties of the battery are also not actually reflected.

Therefore, the application of an in-situ technique is required to directly recognize a real-world situation of an electrode material that occurs while the electrochemical reaction is actually in progress.

However, a separate coin cell or sample needs to be manufactured according to specifications and operating conditions of various pieces of equipment that are to be used according to the existing in-situ techniques. In a current real situation, using general-purpose batteries that are mass-manufactured, it is difficult to verify that the existing in-situ techniques are effective.

The foregoing is intended merely to aid in understanding the background of the present disclosure and thus should not be interpreted to admit that the present disclosure falls within the purview of the related art that is already known to a person of ordinary skill in the art.

SUMMARY

The present disclosure provides an apparatus for and a method of non-destructive-type diagnosis of a degree of battery degradation. Both of the apparatus and the method are capable of quantifying an amount of heat generated in a battery using a thermoelectric element and thus diagnosing a battery for a degree of degradation thereof without disassembling the battery.

According to an aspect of the present disclosure, an apparatus for non-destructive-type diagnosis of a degree of battery degradation includes: a chamber inside which a battery subject to inspection is arranged. The apparatus also includes a charging and discharging unit connected to a lead portion of the battery and charging or discharging the battery. The apparatus also includes a thermoelectric element module thermally connected to the battery inside the chamber and generating an electromotive force caused by heat generated by charging and discharging the battery. The apparatus also includes a first measurement unit measuring the electromotive force generated by the thermoelectric element module. The apparatus also includes a second measurement unit measuring a change in impedance due to the charging and discharging of the battery. The apparatus also includes a determination unit comparing data on the electromotive force of the battery, the electromotive force being measured by the first measurement unit, and data on the impedance of the battery, the impedance being measured by the second measurement unit, with pre-prepared comparative data and determining a degree of degradation of the battery.

In the apparatus, the determination unit may collect the data on the electromotive force measured by the first measurement unit, may quantify a total amount of heat generated in the battery, and may compare the quantified total amount of heat generated with the comparative data.

In the apparatus, the determination unit may derive an impedance waveform through use of the data on the impedance measured by the second measurement unit and may compare the derived impedance waveform with the comparative data.

In the apparatus, the chamber may be a constant-temperature chamber inside which temperature is kept constant.

In the apparatus, the thermoelectric element modules may be combined with the battery in such a manner that respective inside surfaces thereof are brought into surface contact with both lateral surfaces, respectively, of the battery and thus the electromotive force may be generated at the both lateral surfaces of the battery at the same time.

In the apparatus, one lateral surface of each of the thermoelectric element modules may be brought into contact with the battery, and a heat sink may be combined with the other lateral surface thereof.

In the apparatus, the thermoelectric element modules that are positioned on the both lateral surfaces, respectively, of the battery may be pressed in a direction in which the thermoelectric element modules approach each other and thus may apply a surface pressure to the battery.

The apparatus may further include a thermal imaging unit image-capturing a heat distribution of the battery that changes inside the chamber when charging and discharging the battery.

In the apparatus, the determination unit may compare the data on the impedance of the battery, the impedance being measured by the second measurement unit, and the heat distribution of the battery that is image-captured by the thermal imaging unit and may determine a cause of the degradation of the battery.

In the apparatus, the pre-prepared comparative data may be determined as a value of the degree of degradation that is estimated based on the data on the impedance. The impedance is measured in a sample corresponding to each of the subsections that result from linearly dividing a section between a total amount of heat generated that is quantified from an electromotive force measured in a sample of a battery in a fresh state and a total amount of heat generated that is quantified from an electromotive force measured in a sample of a battery that exceeds the end of life.

In the apparatus, the sample of the battery that exceeds the end of life may be determined as a battery that corresponds to or exceeds a reference percentile of a sample group that includes a plurality of samples of the battery that exceed the end of life.

In the apparatus, the first measurement unit may measure the electromotive force generated by the thermoelectric element module due to the heat generated in the battery due to the charging and discharging of the battery, from a starting point in time for the charging and discharging of the battery to an ending point in time for the charging and discharging of the battery.

In the apparatus, the second measurement unit may measure a change in the impedance due to the charging and discharging of the battery from a starting point in time for the charging and discharging of the battery to an end point in time for the charging and discharging of the battery.

In the apparatus, the thermal imaging unit may image-capture the heat distribution of the battery that changes for a reference time from a starting point in time for the charging and discharging of the battery to an ending point in time for the charging and discharging of the battery.

According to another aspect of the present disclosure, a method of non-destructive-type diagnosis of a battery for a degree of degradation thereof includes installing a battery subject to inspection on a thermoelectric element module inside a chamber. The method also includes connecting a charging and discharging unit to a lead portion of the battery and charging or discharging the battery. The method also includes measuring, by a first measurement unit, an electromotive force generated by the thermoelectric element module due to heat generated in the battery due to the charging and discharging of the battery. The method also includes measuring, by a second measurement unit, a change in impedance due to the charging and discharging of the battery. The method also includes comparing, by a determination unit, data on the electromotive force of the battery, the electromotive force being measured by the first measurement unit, and data on the impedance of the battery, the impedance being measured by the second measurement unit, with pre-prepared comparative data and determining a degree of degradation of the battery.

In the apparatus for and the method of non-destructive-type diagnosis of a battery for a degree of degradation thereof, the amount of heat generated by the battery is quantified using a thermoelectric element, and the data on the impedance due to the charging and discharging of the battery is compared with the comparative data. Thus, the battery can be diagnosed for the degree of degradation thereof.

In addition, with the thermal imaging unit that image-captures the heat distribution of the battery, the data on the impedance of the battery and the heat distribution of the battery that is image-captured by the thermal imaging unit are compared with each other. Thus, the cause of the degradation of the battery can be determined.

Accordingly, the advantage of obtaining a degree of gradation of the battery in real time without performing a destructive analysis technique that takes more time to perform, and the advantage of visualizing the cause of the degradation through the thermal imaging unit can be achieved.

BRIEF DESCRIPTION OF THE DRAWINGS

In order that the disclosure may be well understood, there will now be described various forms thereof, given by way of example, reference being made to the accompanying drawings, in which:

FIG. 5 is a flowchart illustrating a method of non-destructive-type diagnosis of a battery for detection of a degree of degradation thereof according to a second embodiment.

The drawings described herein are for illustration purposes only and are not intended to limit the scope of the present disclosure in any way.

DETAILED DESCRIPTION

Unless otherwise described, the expression "a system or a method includes a constituent element," when used throughout the present specification, means that a system or a method includes a constituent element and may further include any other constituent element without the possibility of excluding any other constituent element.

In addition, the terms first, second, and so on are used to describe various constituent elements for the only purpose of distinguishing one constituent element from another. For example, a first constituent element may be named a second constituent element without departing from the scope of the present disclosure that is claimed in the claims. Similarly, the second constituent element may be named the first constituent element. When a component, device, element, or the like of the present disclosure is described as having a purpose or performing an operation, function, or the like, the component, device, or element should be considered herein as being "configured to" meet that purpose or to perform that operation or function.

For disclosure, various embodiments of the present disclosure are described in detail below in terms of configuration and operating principle with reference to the accompanying drawings.

Figure 1:
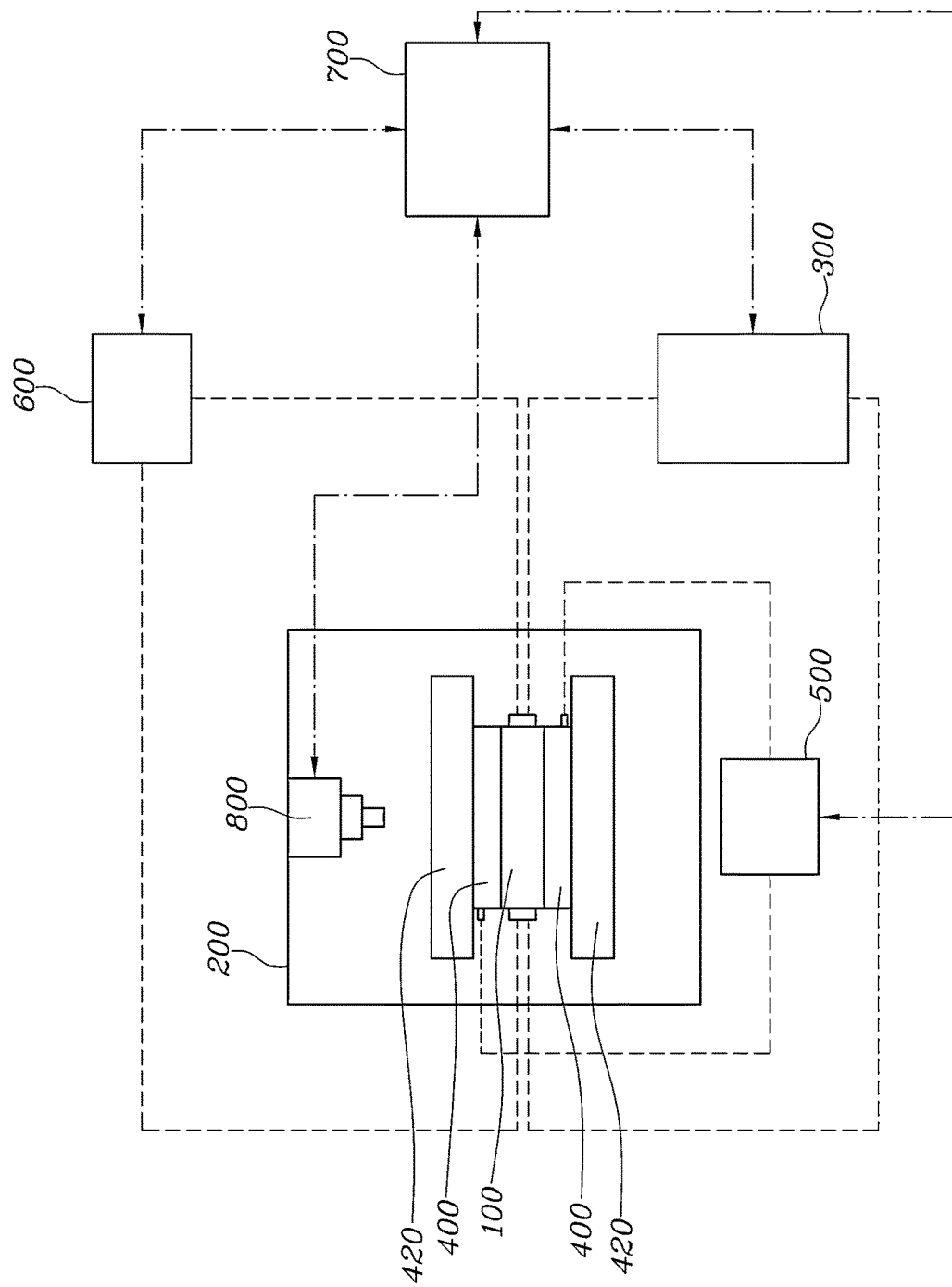
FIG. 1 is a view illustrating an apparatus for non-destructive-type diagnosis of a battery for a degree of degradation thereof according to a first embodiment of the present disclosure.
Figure 2:
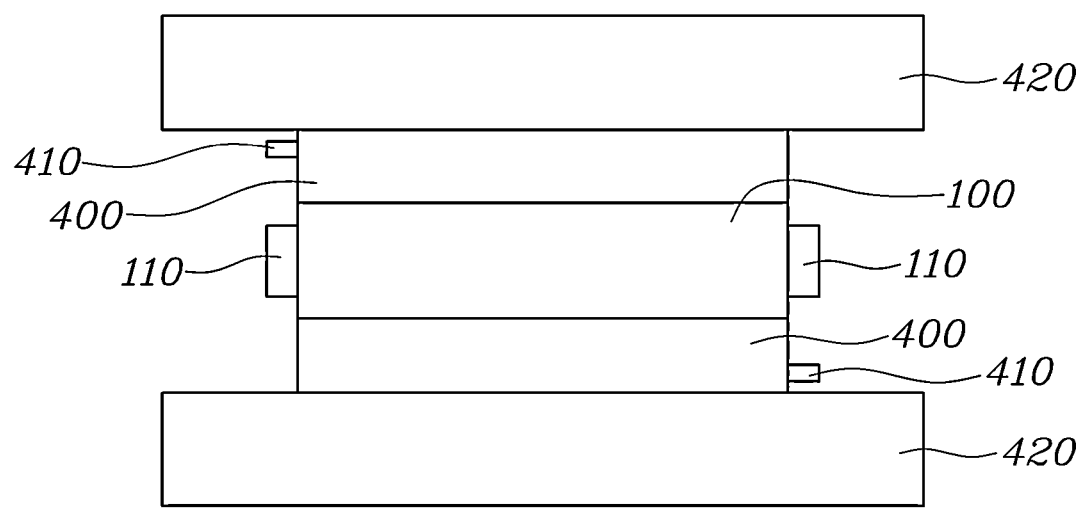
FIG. 2 is a view illustrating a structure where a thermoelectric element module and a battery according to the first embodiment of the present disclosure are combined with each other.
Figure 3:
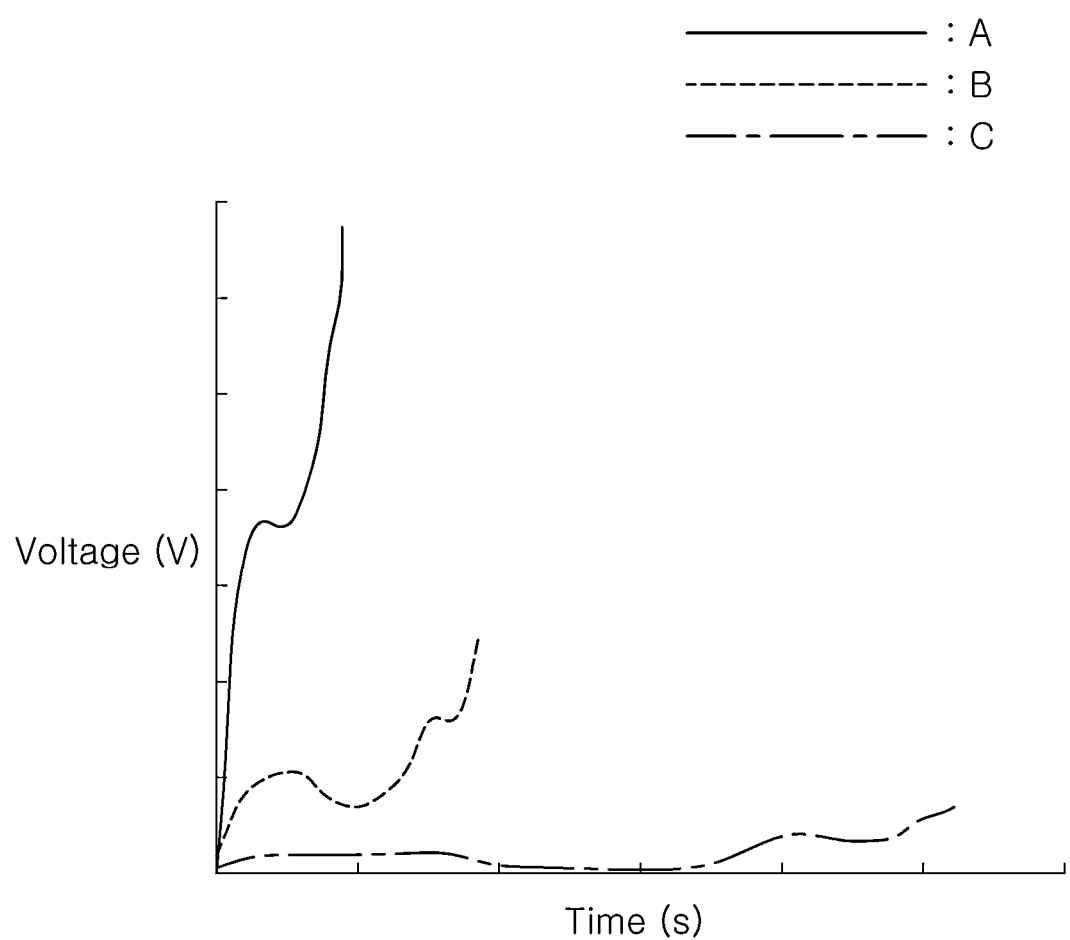
FIG. 3 is a graph showing an amount of heat generated in the battery on a per-charging condition basis.
Figure 4:
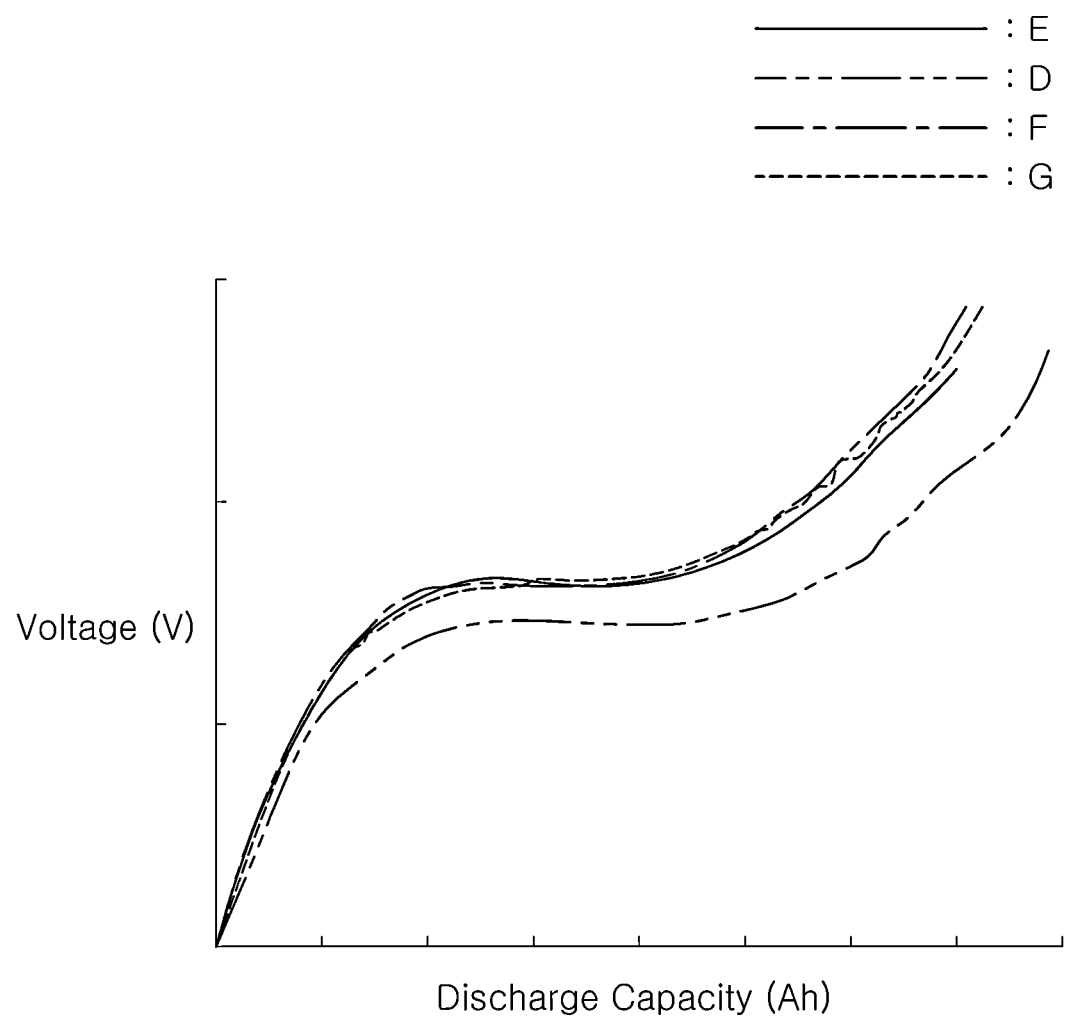
FIG. 4 is a graph showing the amount of heat generated according to a degree of degradation of the battery.

FIG. 1 is a view illustrating an apparatus for non-destructive-type diagnosis of a degree of battery degradation according to a first embodiment of the present disclosure. FIG. 2 is a view illustrating a structure where a thermoelectric element module 400 and a battery 100 according to the first embodiment of the present disclosure are combined with each other. FIG. 3 is a graph showing an amount of heat generated in the battery 100 on a per-charging condition basis. FIG. 4 is a graph showing the amount of heat generated according to a degree of degradation of the battery 100. FIG. 5 is a flowchart depicting a method of non-destructive-type diagnosis of a battery for a degree of degradation thereof according to a second embodiment.

First, techniques of measuring the degree of degradation of the battery 100 in the related art are described to provide assistance in understanding the present disclosure. Then, distinguishing features of constituent elements of the present disclosure are also described.

The high-voltage battery 100, in which an electrochemical reaction occurs, is a high-capacity and high-output battery 100 operating as one system and is utilized as an energy source for fundamentally driving a motor for vehicle traveling. Particularly, environment-friendly vehicles, such as electric vehicles and hydrogen fuel cell vehicles, are each equipped with the high-voltage battery 100 and are driven using electric energy stored in the high-voltage battery 100.

A distance the vehicle can travel, a motor maximum output, and the like are determined by a capacity or voltage of the battery 100. The more increased the usage time of the battery 100, the more increased impedance inside the battery 100. Accordingly, degradation of the battery 100 occurs. The degradation of the battery 100 causes a decrease in output performance, a decrease in capacity, and the like. Thus, acceleration performance of a vehicle that uses the battery 100 is reduced, or the distance the vehicle can travel is decreased.

Therefore, accurate estimation of the degradation of the battery 100 used in the vehicle can accurately predict driving performance of the vehicle and the traveling distance the vehicle can travel and can make it possible to perform a diagnosis function in accordance with a state of the battery 100 or to provide information on a replacement period of the battery 100. Therefore, the convenience of a driver driving the vehicle can be improved.

In addition, the driving of the battery 100 for a long time increases temperature thereof and enhances the risk of fire due to thermal runaway or the like. Therefore, in the terms of safety, there is a need to keep a degree of gradation of the battery 100 at a predetermined level or lower in a controllable manner.

In the related art, in most cases, a technique of diagnosis of the battery 100 is to predict the degree of degradation of the battery 100 or the life thereof. For this prediction, an electrochemical-based degradation model of the battery 100 is established, and then measurement data of the battery 100 are applied to the degradation mode of the battery 100.

Specifically, in the related art, an ex-situ analysis technique is primarily used to diagnose the battery 100. In this technique, charging and discharging of the battery 100 and other electrochemical reactions in the battery are performed. When the reactions are finished, a target subject to analysis is separated and collected to conduct an experiment.

In other words, the technique of diagnosis of the battery 100 in the related art shows only the product that results when the reaction in the battery 100 is finished. Thus, there is a problem that the progress of the electrochemical reaction is not directly shown and that the detailed internal properties of the battery 100 are also not actually reflected.

Therefore, the application of an in-situ technique is required to directly recognize a real-world situation of an electrode material that occurs while the electrochemical reaction is actually in progress.

As the in-situ techniques, X-ray Absorption Spectroscopy (XAS), X-ray Diffraction (XRD) spectroscopy, Nuclear Magnetic Resonance (NMR) spectroscopy, and the like are utilized.

However, the X-ray techniques as described above have to measure an X-ray signal penetrating through a secondary battery that operates. For this reason, there is a limitation that a separate coin cell into which an X-ray can penetrate and in which the electrochemical reaction can proceed has to be manufactured for use. Furthermore, there is also a problem that only an accelerator has to be utilized in order to obtain a precise data value.

In addition, NMR spectroscopy has the problem of requiring experience over a comparatively long period in measuring and interpreting NMR signals for various nuclides. Particularly, solid-state NMR spectroscopy is applied to lithium (Li) that is commonly used as a material of the battery 100. The reason for this is because a measurement signal has a comparatively greater spectrum width than that in liquid-state NMR spectroscopy.

Therefore, Magnetic Angle Spinning (MAS) spectroscopy that measures a magnetic resonance signal while rotating a solid powder specimen at a predetermined angle with a high speed is applied in order to reduce the complexity of the measurement signal. In other words, solid-state NMR spectroscopy has a problem that equipment is more difficult to automate than in liquid-state NMR spectroscopy.

Therefore, for the utilization of the existing in-situ techniques as described above, separate pieces of equipment suitable therefor have to be used. Thus, there is a problem that a battery 100 subject to inspection has to be separately manufactured according to specifications and standards of the separate pieces of equipment.

An apparatus for non-destructive-type diagnosis of a battery for a degree of degradation thereof according to the present disclosure quantifies the amount of heat generated in the battery 100 using a thermoelectric element, compares data on impedance due to the charging and discharging of the battery 100 with comparative data, and diagnoses the battery 100 for the degree of degradation thereof. Thus, the apparatus provides the advantageous effect of obtaining the degree of gradation of the battery 100 in real time without performing a destructive analysis technique (ex-situ analysis technique) that takes more time to perform.

Furthermore, the apparatus employs a structure where the battery 100 subject to inspection is inserted between the thermoelectric element modules 400 for being brought into thermal contact with the thermoelectric element. Thus, the apparatus provides the advantageous effect of being able to verify the degree of gradation using a pouch cell for mass production of the general-purpose batteries 100 without the need to separately manufacture the battery 100 subject to inspection.

Essential features of each constituent element according to the present disclosure are described in more detail with reference to FIGS. 1-4.

With reference to FIGS. 1 and 2, the apparatus for non-destructive-type diagnosis of a battery for a degree of degradation thereof includes a chamber 200, a charging and discharging unit 300, a thermoelectric element module 400, a first measurement unit 500, a second measurement unit 600, and a determination unit 700. A battery 100 subject to inspection is arranged inside the chamber 200. The charging and discharging unit 300 is connected to a lead portion 110 of the battery 100 and charges or discharges the battery 100. The thermoelectric element module 400 is thermally connected to the battery 100 inside the chamber 200 and generates an electromotive force caused by heat generated by charging and discharging the battery 100. The first measurement unit 500 measures the electromotive force generated by the thermoelectric element module 400. The second measurement unit 600 measures a change in impedance due to the charging and discharging of the battery 100. The determination unit 700 compares data on the electromotive force of the battery 100, the electromotive force being measured by the first measurement unit 500, and data on the impedance of the battery 100, the impedance being measured by the second measurement unit 600, with pre-prepared comparative data. The determination unit 700 also determines a degree of degradation of the battery 100.

In other words, the thermoelectric element module 400 may be installed inside the chamber 200, and the battery 100 subject to inspection may be mounted on the thermoelectric element module 400 in such a manner as to be connected thereto. The charging and discharging unit 300 is connected to the lead portion 110 of the battery 100 subject to inspection and charges and discharges the battery 100. The first measurement unit 500 measures the electromotive force generated by the thermoelectric element module 400. The electromotive force is generated due to heat generated in the battery 100. The generation of the heat is due to the charging and discharging of the battery 100. The determination unit 700 determines the degree of gradation of the battery 100 using the data on the measured electromotive force.

Specifically, the charging and discharging unit 300 may be realized as a charging and discharging cycle generator that generates a cycle with which the battery 100 is charged or discharged. In other words, the charging and discharging unit 300 is connected to the lead portion 110 of the battery 100 and generates a charging and discharging cycle for the battery 100. When testing cycling for the charging and discharging of the battery 100, according to specifications of the battery 100, charging electric current is set to be selected from a section from ⅓C to 3C, and discharging electric current is set to be selected from a section from ⅓C to 6C. Desirably, when considering the safety of the battery 100, the charging electric current is set to be selected from a section from ⅓C to 1.5C, and the discharging electric current is set to be selected from a section from ⅓C to 2C.

In FIG. 3, Curve A represents an amount of heat generated under the condition that the charging and discharging electric current is 2C, Curve B represents an amount of heat generated under the condition that the charging and discharging electric current is 1C, and Curve C represents an amount of heat generated under the condition that the charging and discharging electric current is ⅓C. Referring to FIG. 3, an amount of heat emitted from the battery 100 varies with the charging and discharging conditions and that an amount of heat generated from the thermoelectric element also varies accordingly. Specifically, the amount of heat generated over time under the condition that the charging and discharging electric current is 2C is most precisely measured. Therefore, most desirably, the degree of gradation of the battery 100 is measured through the amount of heat generated under the condition that the charging and discharging electric current is 2C.

Therefore, FIG. 4 shows that the amount of heat generated varies with the degree of degradation that is quantified according to the amount of heat generated in the battery 100, which is measured under the condition that the charging and discharging electric current is 2C. Curve D in FIG. 4 represents an amount of heat generated in a sample of a new battery 100 that has not undergone degradation, as a battery 100 in a fresh state. Curves E, F, and G represent amounts of heat generated in samples, respectively, of the battery 100 that are different in the degree of degradation from each other.

In addition, the apparatus for non-destructive-type diagnosis of a battery for a degree of degradation thereof according to the present disclosure includes the determination unit 700 that collects data required to diagnose the battery 100 for the degree of degradation thereof, makes a determination, and outputs an instruction for operating each of the other constituent elements. The determination unit 700 may be realized as a type of controller that includes a memory in which various comparative data necessary to diagnose the battery 100 for the degree of gradation thereof are stored.

The determination unit 700 of the apparatus for non-destructive-type diagnosis of a battery for a degree of degradation thereof according to the present disclosure collects data from the first measurement unit 500, the second measurement unit 600, the charging and discharging unit 300, and a thermal imaging unit 800 and makes a determination. For reference, in FIG. 1, to show this functional relationship, connections of the determination unit 700 and each of the other constituent elements are indicated by dash-dotted lines.

It can be understood that data required to diagnose the battery 100 for the degree of gradation thereof mean data, including electric current, voltage, temperature, and the like of the battery 100.

More specifically, as the temperature of the battery 100 increases when charging and discharging the battery 100, the electromotive force is generated by the thermoelectric element module 400 thermally connected to the battery 100. It is necessary to measure the electromotive force. The generated electromotive force is measured by the first measurement unit 500 connected to the lead portion 410 of the thermoelectric element module 400.

Fundamentally, the apparatus for non-destructive-type diagnosis of a battery for a degree of degradation thereof according to the present disclosure quantifies a total amount of heat generated in the battery 100 using the thermoelectric element, compares the quantified total amount of heat generated with the comparative data, and thus diagnoses the battery 100 for the degree of gradation thereof.

In other words, the determination unit 700 of the apparatus for non-destructive-type diagnosis of a battery for a degree of degradation thereof according to the present disclosure may collect the data on the electromotive force measured by the first measurement unit 500, may quantify the total amount of heat generated in the battery 100, and may compare the quantified total amount of heat generated with the comparative data.

At this point, although the amounts of heat generated that are quantified through the electromotive force are derived as ones having the same value, impedance profiles that depend on impedance inside the battery 100 may vary.

Therefore, the second measurement unit 600 of the apparatus for non-destructive-type diagnosis of a battery for a degree of degradation thereof according to the present disclosure measures a change in the impedance inside the battery 100 when charging and discharging the battery 100. Subsequently, the apparatus compares with the pre-prepared comparative data the data on the measured electromotive force and the data on the electromotive force of the battery 100 that is measured by the first measurement 500, and thus the apparatus determines the degree of gradation of the battery 100. Thus, the degree of gradation of the battery 100 is measured in a more accurate and precise manner.

In other words, the determination unit 700 of the apparatus for non-destructive-type diagnosis of a battery for a degree of degradation thereof according to the present disclosure may derive an impedance waveform through use of the data on the impedance measured by the second measurement unit 600 and may compare the derived impedance waveform with the comparative data.

The pre-prepared comparative data may be determined as a value of the degree of degradation. The value of the degree of degradation is estimated based on the data on the impedance. The impedance is measured in a sample corresponding to each of the subsections that result from linearly dividing a section between a total amount of heat generated that is quantified from an electromotive force measured in a sample of a battery in a fresh state and a total amount of heat generated that is quantified from an electromotive force measured in a sample of a battery that exceeds the end of life (EOL).

For example, in a case where a total amount of heat generated that is quantified from an electromotive force measured in a sample of a battery in a fresh state is 0.8 V and where a total amount of heat generated that is quantified from an electromotive force measured in a sample of a battery that exceeds the EOL is 0.4 V, a section between the two amounts of heat generated is divided linearly into sub-sections. In order to obtain a data value of impedance, the impedance is additionally measured in a sample corresponding to each of the sub-sections. Accordingly, the comparative data may be derived by determining, as 50%, the degree of degradation or the life that corresponds to the total amount of heat generated that is 0.6 V. The comparative data that are derived in this manner may be listed up in a format that is the same as that of a degree-of-degradation table and may be stored in a memory built into the determination unit 700.

For reference, at this point, of course, a total amount of heat generated that is quantified from an electromotive force measured in a sample of a battery having a predetermined amount of remaining power (a battery having the middle of life (MOL) may be included within the section between the total amount of heat generated that is quantified from an electromotive force measured in a sample of a battery in a fresh state and the total amount of heat generated that is quantified from an electromotive force measured in a sample of a battery that exceeds the EOL.

The sample of the battery 100 that exceeds the EOL may be determined as a battery 100 that corresponds to or exceeds a reference percentile of a sample group that includes a plurality of samples of the battery 100 that exceed the EOL.

It can be understood that the "reference percentile" here means a 90 percentile. In other words, when it is assumed that 100 batteries 100 that exceed the EOL are collected, batteries 100 that are ranked ninetieth to hundredth in order of decreasing performance, i.e., in order of increasing the degree of degradation may be used as batteries 100 in creating the degree-of-degradation table.

The chamber 200 of the apparatus for non-destructive-type diagnosis of a battery for a degree of degradation thereof according to the present disclosure may be a constant-temperature chamber 200 inside which temperature is kept constant.

As described above, the apparatus for non-destructive-type diagnosis of a battery for a degree of degradation thereof according to the present disclosure measures the electromotive force due to a change in temperature that occurs when charging and discharging the battery 100, collects the measured electromotive force, quantifies the total amount of heat generated, and thus measures the degree of gradation of the battery 100.

Therefore, in order to derive a precise amount of heat generated, temperature inside the chamber 200 has to be kept constant. In particular, the apparatus for non-destructive-type diagnosis of a degree of battery degradation according to the present disclosure derives the amount of heat generated in a more precise manner using a constant-temperature chamber 200 and thus measures the high-reliability degree of degradation of the battery 100.

For reference, the constant-temperature chamber 200 is a component inside which temperature and humidity can be kept at a predetermined value. Usually, the constant-temperature chamber 200 is made up of a cooler that supplies cool air, a fan heater that supplies warm air, and a humidifier that keeps indoor air humidity constant. Desirably, the constant-temperature chamber 200 according to the present disclosure sets a difference in temperature between a surface of the battery 100 and inside air of the chamber 200 to a temperature of 10 to 15° C.

With reference to FIGS. 1 and 2, the thermoelectric element modules 400 of the apparatus for non-destructive-type diagnosis of a battery for a degree of degradation thereof according to the present disclosure are combined with the battery 100 in such a manner that respective inside surfaces thereof are brought into surface contact with both lateral surfaces, respectively, of the battery 100. Thus, the electromotive force can be generated at the both lateral surfaces of the battery 100 at the same time.

As described above, heat is generated on a surface of the battery 100 when charging and discharging the battery 100. The batteries 100 are usually mass-manufactured in the form of a pouch cell. Therefore, in order to measure the amount of heat generated by the battery 100 in a more precise manner, amounts of heat generated on both lateral sides thereof have to be both measured.

Therefore, in the apparatus for non-destructive-type diagnosis of a battery for a degree of degradation thereof according to the present disclosure, the thermoelectric element modules 400 are combined with the battery 100 in such a manner that respective inside surfaces thereof are brought into surface contact with the both lateral surfaces, respectively, of the battery 100. Thus, the electromotive force is generated at the same time as heat is generated on the both lateral surfaces of the battery 100.

In other words, two contact portions are formed in the upward-downward direction on the thermoelectric element modules 400, respectively, in such a manner that the thermoelectric element modules 400 are combined with the both lateral surfaces, respectively, of the battery 100. It can be understood that the battery 100 is inserted between these two contact portions for being mounted thereon. Accordingly, the advantageous effect of easily verifying the degree of degradation using a pouch cell for mass production of the general-purpose batteries 100 can be achieved.

One lateral surface of each of the thermoelectric element modules 400 of the apparatus for non-destructive-type diagnosis of a battery for a degree of degradation thereof according to the present disclosure may be brought into contact with the battery 100, and a heat sink 420 may be combined with the other lateral surface thereof.

The heat generated from the battery 100 is conducted to the heat sink 420 through the thermoelectric element. Accordingly, a distribution of temperature inside the battery 100 can be indirectly recognized when charging and discharging the battery 100. In other words, the distribution of temperature conducted to the heat sink 420 is image-captured by the thermal imaging unit 800 or the like. A situation where the battery 100 is locally degrading can be individually checked. This local degradation is described in more detail below, along with the thermal imaging unit 800.

Moreover, the heat sink 420 as described below may press against the thermoelectric element module 400 and thus may apply a predetermined surface pressure to the battery 100. The applying of the surface pressure is performed to realize a real-world situation in a state where the battery 100 is mounted in a vehicle or the like, and the applying of the surface pressure is described additionally below.

In the apparatus for non-destructive-type diagnosis of a battery for a degree of degradation thereof according to the present disclosure, the thermoelectric element modules 400 that are positioned on the both lateral surfaces, respectively, of the battery 100 are pressed in a direction in which the thermoelectric element modules 400 approach each other. Thus the thermoelectric element modules 400 may apply the surface pressure to the battery 100.

A general-purpose battery 100, when mounted in a vehicle or the like, receives a predetermined pressure according to an arrangement of other electric components. In other words, the apparatus for non-destructive-type diagnosis of a battery for a degree of degradation thereof according to the present disclosure applies the surface pressure to the battery 100 to realize a real-world situation in the state where the battery 100 is mounted in a vehicle or like.

In other words, at this point, it can be understood that a value of the pressure applied to the thermoelectric element module 400 is the same as a value of pressure applied to a real-world thermoelectric element module.

Specifically, a separate pressing unit, made up of a separate stationary portion and a separate fastening portion, may be formed on the heat sink 420 combined with the thermoelectric element module 400. The thermoelectric element modules 400, positioned on the both lateral surfaces, respectively, of the battery 100, may be pressed by the pressing unit in the direction in which the thermoelectric element modules approach each other. Accordingly, the surface pressure is applied to the battery 100, and thus a situation of the battery 100 in a state where the battery 100 is actually mounted in a vehicle or the like can be realized. The advantageous effect of being able to diagnose the battery 100 for the degree of degradation thereof in a more reliable manner can be achieved.

The apparatus for non-destructive-type diagnosis of a battery for a degree of degradation thereof according to the present disclosure may further include the thermal imaging unit 800 that image-captures a heat distribution of the battery 100 that changes inside the chamber 200 when charging and discharging the battery 100.

The determination unit 700 of the apparatus for non-destructive-type diagnosis of a battery for a degree of degradation thereof according to the present disclosure may compare the data on the impedance of the battery 100, the impedance being measured by the second measurement unit 600, and the heat distribution of the battery 100 that is image-captured by the thermal imaging unit 800, and may determine a cause of the degradation of the battery 100.

In other words, the situation where the battery is locally degrading is checked through the distribution of temperature of the battery 100, unlike in a case where the amount of heat generated in the battery 100 is quantified using the thermoelectric element, where the data on the impedance due to the charging and discharging of the battery 100 is compared with the comparative data, and where the battery 100 is diagnosed for the degree of degradation thereof.

Specifically, the thermal imaging unit 800 or the like image-captures the distribution of temperature conducted to the heat sink 420, collects the data on the impedance of the battery 100, the impedance being measured by the second measurement unit 600, and determines a cause of the local degradation of the battery 100. The impedance data have impedance profiles that vary according to a usage environment of the battery 100, or according to which portion of an internal structure (including a lead portion, an anode, a cathode, and the like) of the battery 100 has a high degree of degradation. Therefore, through these different impedance profiles, the cause of the degradation can be primarily identified. The cause of the degradation is additionally identified through the thermal imaging unit 800, and thus the more precise cause of the degradation can be derived.

Furthermore, the cause of the degradation derived in this manner is visualized through the thermal imaging unit 800. Thus, the advantage of checking in real time the situation where the battery 100 is degrading, as well as utilizing the in-situ technique, can be achieved.

The first measurement unit 500 of the apparatus for non-destructive-type diagnosis of a battery for a degree of degradation thereof according to the present disclosure may measure the electromotive force of the thermoelectric element module 400, which is generated due to the heat generated in the battery 100 due to the charging and discharging of the battery 100. The measurement of the he electromotive force of the thermoelectric element module 400 is performed from a starting point in time for the charging and discharging of the battery 100 to an ending point in time for the charging and discharging of the battery 100.

The first measurement unit 500 measures the electromotive force generated by the thermoelectric element module 400 due to the heat that is generated in the battery 100 due to a change in an amount of charge when charging and discharging the battery 100. For this reason, the first measurement unit 500 may include a sensor that senses the change in the amount of charge in the battery 100. The sensor senses the change in the amount of charge in the battery 100 from a starting point in time for the use of the battery 100 to an ending point in time for the use of the battery 100. The battery 100, when fully charged, is defined as being in a 100% state of charge. The battery 100, when fully discharged, is defined as being in a 0% state of charge. According to this definition, a currently charged state of the battery 100 is detected.

It can be understood that the starting point in time for the use of the battery 100 is a starting point in time for the charging and discharging of the battery 100 and that the ending point in time for the use of the battery 100 is an ending point in time for the charging and discharging of the battery 100. At this point, the reason for measuring the electromotive force generated by the thermoelectric element module 400 from the starting point in time for the charging and discharging of the battery 100 is because the temperature inside the battery 100 also rises linearly when charging the battery 100 and thus the electromotive force is accordingly generated. The measurement of the electromotive force generated by the thermoelectric element module 400 from the starting point in time for the charging and discharging of the battery 100 can achieve the advantageous effect of measuring the degree of gradation of the battery 100 in a more precise manner.

The second measurement unit 600 of the apparatus for non-destructive-type diagnosis of a battery for a degree of degradation thereof according to the present disclosure may measure a change in the impedance due to the charging and discharging of the battery 100 from the starting point in time for the charging and discharging of the battery 100 to the end point in time for the charging and discharging of the battery 100.

The second measurement unit 600 measures the change in the impedance inside the battery 100 due to the change in the amount of charge when charging and discharging the battery 100. Therefore, as is the case with the first measurement unit 500, the sensor that senses the change in the amount of charge in the battery 100 may be provided. The sensor senses the change in the amount of charge in the battery 100 and measures the change in the amount of charge in the battery 100 from the starting point in time for the use of the battery 100 to the ending point in time therefore. The battery 100, when fully charged, is defined as being in the 100% state of charge. The battery 100, when fully discharged, is defined as being in the 0% state of charge. According to this definition, a currently charged state of the battery 100 is detected.

It can be understood that the starting point in time for the use of the battery 100 is a starting point in time for the charging and discharging of the battery 100 and that the ending point in time for the use of the battery 100 is an ending point in time for the charging and discharging of the battery 100. At this point, the reason for measuring the change in the impedance from the starting point in time for the charging and discharging of the battery 100 is because the temperature inside the battery 100 also rises linearly when charging the battery 100 and thus the impedance inside the battery 100 changes. The measurement of the change in the impedance inside the battery 100 from the starting point in time for the charging and discharging of the battery 100 can achieve the advantageous effect of measuring the degree of gradation of the battery 100 in a more precise manner.

The thermal imaging unit 800 of the apparatus for non-destructive-type diagnosis of a battery for a degree of degradation thereof according to the present disclosure may image-capture the heat distribution of the battery 100 that changes for a reference time from the starting point in time for the charging and discharging of the battery 100 to the ending point in time for the charging and discharging of the battery 100.

The thermal imaging unit 800 image-captures the distribution of the temperature that changes at a surface of the battery 100 according to the change in the amount of charge when charging and discharging the battery 100. Therefore, as is the case with the first measurement unit 500, the sensor that senses the change in the amount of charge in the battery 100 may be provided. The sensor senses the change in the amount of charge in the battery 100 and measures the change in the amount of charge in the battery 100 from the starting point in time for the use of the battery 100 to the ending point in time therefore. The battery 100, when fully charged, is defined as being in the 100% state of charge. The battery 100, when fully discharged, is defined as being in the 0% state of charge. According to this definition, a currently charged state of the battery 100 is detected.

It can be understood that the starting point in time for the use of the battery 100 is a starting point in time for the charging and discharging of the battery 100 and that the ending point in time for the use of the battery 100 is an ending point in time for the charging and discharging of the battery 100. At this point, the reason for image-capturing the heat distribution of the battery 100 for the reference time from the starting point in time for the charging and discharging of the battery 100 to the ending point in time for the charging and discharging of the battery 100 is because the highest temperature of a general-purpose battery 100 is reached within five minutes after the starting point in time for the charging of the battery 100. Therefore, it can be understood that the reference time here is 5 minutes or shorter. However, the reference time of 5 minutes is provided as only an example to provide assistance in understanding the present disclosure. The reference time may vary according to specifications of the battery 100. The present disclosure should not be limited to the reference time of 5 minutes.

In conclusion, the heat distribution of the battery 100 that occurs until the highest temperature thereof is reached is image-captured by the thermal imaging unit 800, and thus the cause of the degradation of the battery 100 can be identified in real time. The thermal imaging unit 800 may be driven only for a predetermined time, and thus power consumption necessary to drive the thermal imaging unit 800 can be reduced. Furthermore, the advantageous effect of efficiently identifying the cause of the degradation of the battery 100 can be achieved.

FIG. 5 is a flowchart for a method of non-destructive-type diagnosis of a battery for a degree of degradation thereof according to a second embodiment of the present disclosure.

With reference to FIG. 5, the method of non-destructive-type diagnosis of a battery for a degree of degradation thereof according to the present disclosure may include Step S100 of installing a battery subject to inspection on a thermoelectric element module inside a chamber. The method may also include Step S200 of connecting a charging and discharging unit to a lead portion of the battery and charging or discharging the battery. The method may also include Step S300 of measuring, by a first measurement unit, an electromotive force generated by the thermoelectric element module due to heat generated in the battery due to the charging and discharging of the battery. The method may also include Step S400 of measuring, by a second measurement unit, a change in impedance due to the charging and discharging of the battery. The method may also include Step S500 of comparing, by a determination unit, data on the electromotive force of the battery, the electromotive force being measured by the first measurement unit, and data on the impedance of the battery, the impedance being measured by the second measurement unit, with pre-prepared comparative data and determining a degree of degradation of the battery.

Specifically, the battery subject to inspection is inserted into the thermoelectric element module inside the chamber in such a manner as to be thermally connected thereto (S100). The charging and discharging unit is connected to the lead portion of the battery, and thus the battery is charged or discharged by generating the charging and discharging cycle (S200). At this point, at an initial testing stage, the battery may be first charged. The method may further include, after Step S100 of installing a battery subject to inspection on a thermoelectric element module inside a chamber, a step of adjusting temperature inside the chamber and thus setting the temperature inside the chamber in such a manner as to be maintained uniformly within a preset reference temperature range. It can be understood that the step further included serves as a step for uniformly maintaining the temperature inside the chamber 200 at a temperature of 10 to 15° C. in order to derive a precise amount of heat generated.

In addition, in the method, Step S200 of connecting a charging and discharging unit to a lead portion of the battery and charging or discharging the battery may include a step of stabilizing temperature of the battery for a preset reference time after an ending point in time for charging when charging the battery. It can be understood that the step further included serves as a step for stabilizing to a predetermined level the temperature of the battery that rises while charging the battery after the charging of the battery is completed.

Subsequently, the first measurement unit measures the electromotive force generated by the thermoelectric element module due to the heat generated in the battery due to the charging and discharging of the battery, and the second measurement unit measures the change in the impedance due to the charging and discharging of the battery (S300 and S400). The determination unit compares the data on the electromotive force of the battery, the electromotive force being measured by the first measurement unit, and the data on the impedance of the battery, the impedance being measured by the second measurement unit, with the pre-prepared comparative data and determines the degree of degradation of the battery (S500).

The method may further include, after Step S400 of measuring, by a second measurement unit, a change in impedance due to the charging and discharging of the battery, a step of image-capturing, by a thermal imaging unit, a heat distribution of the battery that changes when charging and discharging the battery subject to inspection. The method may further include, after Step S400 of measuring, by a second measurement unit, a change in impedance due to the charging and discharging of the battery, a step of comparing, by the determination unit, the data on the impedance measured by the second measurement unit and the heat distribution image-captured by the thermal imaging unit and determining a cause of degradation of the battery.

The specific embodiments of the present disclosure are described above with the accompanying drawings and it should be apparent to a person of ordinary skill in the art that various modifications and alterations are possibly made to the present disclosure without departing from the nature and gist of the present disclosure.

What is claimed is:

1. An apparatus for non-destructive-type diagnosis of a degree of degradation of a battery, the apparatus comprising:
    a chamber inside which a battery subject to inspection is arranged;
    a charging and discharging unit connected to a lead portion of the battery and configured to charge or discharge the battery;
    a thermoelectric element module thermally connected to the battery inside the chamber and configured to generate an electromotive force caused by heat generated by charging and discharging the battery;
    a first measurement unit configured to measure the electromotive force generated by the thermoelectric element module;
    a second measurement unit configured to measure a change in impedance due to the charging and discharging of the battery; and
    a determination unit configured to compare data on the electromotive force of the battery, the electromotive force being measured by the first measurement unit, and data on the impedance of the battery, the impedance being measured by the second measurement unit, with pre-prepared comparative data and determining a degree of degradation of the battery,
    wherein the thermoelectric element modules are combined with the battery in such a manner that respective inside surfaces of the thermoelectric element modules are brought into surface contact with both lateral surfaces, respectively, of the battery and thus the electromotive force is generated at the both lateral surfaces of the battery at the same time.

2. The apparatus of claim 1, wherein the determination unit collects the data on the electromotive force measured by the first measurement unit, quantifies a total amount of heat generated in the battery, and compares the quantified total amount of heat generated with the comparative data.

3. The apparatus of claim 1, wherein the determination unit derives an impedance waveform through use of the data on the impedance measured by the second measurement unit and compares the derived impedance waveform with the comparative data.

4. The apparatus of claim 1, wherein the chamber is a constant-temperature chamber inside which temperature is kept constant.

5. The apparatus of claim 1, wherein one lateral surface of each of the thermoelectric element modules is brought into contact with the battery, and a heat sink is combined with the other lateral surface thereof.

6. The apparatus of claim 1, wherein the thermoelectric element modules that are positioned on the both lateral surfaces, respectively, of the battery are pressed in a direction in which the thermoelectric element modules approach each other and thus applies a surface pressure to the battery.

7. The apparatus of claim 1 further comprising:
    a thermal imaging unit image-capturing a heat distribution of the battery that changes inside the chamber when charging and discharging the battery.

8. The apparatus of claim 7, wherein the determination unit compares the data on the impedance of the battery, the impedance being measured by the second measurement unit, and the heat distribution of the battery that is image-captured by the thermal imaging unit and determines a cause of the degradation of the battery.

9. The apparatus of claim 7, wherein the thermal imaging unit image-captures the heat distribution of the battery that changes for a reference time from a starting point in time for the charging and discharging of the battery to an ending point in time for the charging and discharging of the battery.

10. The apparatus of claim 1, wherein the pre-prepared comparative data is determined as a value of the degree of degradation that is estimated based on the data on the impedance, wherein the impedance is measured in a sample corresponding to each of subsections that result from linearly dividing a section between a total amount of heat generated that is quantified from an electromotive force measured in a sample of a battery in a fresh state and a total amount of heat generated that is quantified from an electromotive force measured in a sample of a battery that exceeds an end of life.

11. The apparatus of claim 10, wherein the sample of the battery that exceeds the end of life is determined as a battery that corresponds to or exceeds a reference percentile of a sample group that includes a plurality of samples of the battery that exceed the end of life.

12. The apparatus of claim 1, wherein the first measurement unit measures the electromotive force generated by the thermoelectric element module due to the heat generated in the battery due to the charging and discharging of the battery, from a starting point in time for the charging and discharging of the battery to an ending point in time for the charging and discharging of the battery.

13. The apparatus of claim 1, wherein the second measurement unit measures a change in the impedance due to the charging and discharging of the battery from a starting point in time for the charging and discharging of the battery to an end point in time for the charging and discharging of the battery.

14. A method of non-destructive-type diagnosis of a degree of degradation of a battery, the method comprising:
   installing a battery subject to inspection on a thermoelectric element module inside a chamber;
   connecting a charging and discharging unit to a lead portion of the battery and charging or discharging the battery;
   measuring, by a first measurement unit, an electromotive force generated by the thermoelectric element module due to heat generated in the battery due to the charging and discharging of the battery;
   measuring, by a second measurement unit, a change in impedance due to the charging and discharging of the battery; and
   comparing, by a determination unit, data on the electromotive force of the battery, the electromotive force being measured by the first measurement unit, and data on the impedance of the battery, the impedance being measured by the second measurement unit, with pre-prepared comparative data and determining a degree of degradation of the battery,
   wherein the pre-prepared comparative data is determined as a value of the degree of degradation that is estimated based on the data on the impedance, wherein the impedance is measured in a sample corresponding to each of subsections that result from linearly dividing a section between a total amount of heat generated that is quantified from an electromotive force measured in a sample of a battery in a fresh state and a total amount of heat generated that is quantified from an electromotive force measured in a sample of a battery that exceeds an end of life.

15. The method of claim 14, wherein the sample of the battery that exceeds the end of life is determined as a battery that corresponds to or exceeds a reference percentile of a sample group that includes a plurality of samples of the battery that exceed the end of life.

16. An apparatus for non-destructive-type diagnosis of a degree of degradation of a battery, the apparatus comprising:
   a chamber inside which a battery subject to inspection is arranged;
   a charging and discharging unit connected to a lead portion of the battery and configured to charge or discharge the battery;
   a thermoelectric element module thermally connected to the battery inside the chamber and configured to generate an electromotive force caused by heat generated by charging and discharging the battery;
   a first measurement unit configured to measure the electromotive force generated by the thermoelectric element module;
   a second measurement unit configured to measure a change in impedance due to the charging and discharging of the battery;
   a determination unit configured to compare data on the electromotive force of the battery, the electromotive force being measured by the first measurement unit, and data on the impedance of the battery, the impedance being measured by the second measurement unit, with pre-prepared comparative data and determining a degree of degradation of the battery; and
   a thermal imaging unit image-capturing a heat distribution of the battery that changes inside the chamber when charging and discharging the battery,
   wherein the determination unit compares the data on the impedance of the battery, the impedance being measured by the second measurement unit, and the heat distribution of the battery that is image-captured by the thermal imaging unit and determines a cause of the degradation of the battery.

17. The apparatus of claim 16, wherein the thermal imaging unit image-captures the heat distribution of the battery that changes for a reference time from a starting point in time for the charging and discharging of the battery to an ending point in time for the charging and discharging of the battery.

* * * * *